(12) United States Patent
Petro et al.

(10) Patent No.: US 6,219,686 B1
(45) Date of Patent: Apr. 17, 2001

(54) METHOD AND APPARATUS FOR AN N-NARY SUM/HPG ADDER/SUBTRACTOR GATE

(75) Inventors: Anthony M. Petro; James S. Blomgren, both of Austin, TX (US)

(73) Assignee: Intrinsity, Inc., Austin, TX (US)

( * ) Notice: Subject to any disclaimer, the term of this patent is extended or adjusted under 35 U.S.C. 154(b) by 0 days.

(21) Appl. No.: 09/150,717

(22) Filed: Sep. 10, 1998

Related U.S. Application Data

(60) Provisional application No. 60/069,250, filed on Dec. 11, 1997.

(51) Int. Cl.[7] ................................. G06F 7/50; G06F 7/00
(52) U.S. Cl. ............................................. 708/670; 708/493
(58) Field of Search ........................... 708/670, 680–685, 708/700–714

(56) References Cited

U.S. PATENT DOCUMENTS

| | | | |
|---|---|---|---|
| 4,914,614 | * 4/1990 | Yamakawa | ............................. 708/493 |
| 5,208,490 | * 5/1993 | Yetter | ....................................... 326/98 |
| 5,467,298 | * 11/1995 | Yoshida | ................................. 708/493 |
| 5,499,203 | * 3/1996 | Grundland | ............................ 708/710 |
| 6,003,059 | * 12/1999 | Bechade | ................................ 708/714 |

* cited by examiner

Primary Examiner—Chuong Dinh Ngo
(74) Attorney, Agent, or Firm—Booth & Wright, L.L.P.; Matthew J. Booth

(57) ABSTRACT

The present invention uses N-nary logic to perform addition or subtraction, along with carry propagate logic, within one gate. The gate produces as outputs a 1-of-4 result value and a 1-of-3 HPG indicator. The preferred embodiment of the present invention implements subtraction using three's complement addition. In an alternative embodiment, four's complement addition is implemented to achieve the subtract function and the HPG indicator is a 1-of-2 signal that combines the H(alt) and P(rop) indications.

38 Claims, 9 Drawing Sheets

METHOD AND APPARATUS FOR AN N-NARY SUM/HPG ADDER/SUBTRACTOR GATE

This application claims the benefits of the earlier filed U.S. Provisional Application Serial No. 60/069250, filed Dec. 11, 1997, which is incorporated by reference for all purposes into this application.

BACKGROUND OF THE INVENTION

1. Field of the Invention

The present invention relates to digital computing, and more particularly to an apparatus and method for implementing carry-lookahead logic in an N-NARY adder/subtractor gate.

2. Description of the Related Art

Traditional Binary Addition

In most computer systems, addition and subtraction of numbers is supported. In systems using traditional binary logic, the truth table for one-bit addition is set forth in Table 1.

TABLE 1

| A | B | A + B |
|---|---|-------|
| 0 | 0 | 0     |
| 0 | 1 | 1     |
| 1 | 0 | 1     |
| 1 | 1 | 0*    |

In the last row of Table 1, a carry condition occurs. That is, the result is 0, but a carry into the next-higher-order bit position, corresponding to a decimal value of 2, has conceptually occurred.

In addition to single bits, the addition operation maybe performed on multiple bits, including addition of two two-bit values. The truth table for such an operation is set forth in Table 2, where the first operand A is a two-bit value comprising bits $A_0$ and $A_1$. The second operand, B, is a two-bit value comprising bits $B_0$ and $B_1$.

TABLE 2

| $A_1$ | $A_0$ | $B_1$ | $B_0$ | A = Decimal Value | B = Decimal Value | A + B | A + B = Dec. Value |
|-------|-------|-------|-------|-------------------|-------------------|-------|--------------------|
| 0 | 0 | 0 | 0 | 0 | 0 | 00  | 0 |
| 0 | 0 | 0 | 1 | 0 | 1 | 01  | 1 |
| 0 | 0 | 1 | 0 | 0 | 2 | 10  | 2 |
| 0 | 0 | 1 | 1 | 0 | 3 | 11  | 3 |
| 0 | 1 | 0 | 0 | 1 | 0 | 01  | 1 |
| 0 | 1 | 0 | 1 | 1 | 1 | 10  | 2 |
| 0 | 1 | 1 | 0 | 1 | 2 | 11  | 3 |
| 0 | 1 | 1 | 1 | 1 | 3 | 00* | 0 |
| 1 | 0 | 0 | 0 | 2 | 0 | 10  | 2 |
| 1 | 0 | 0 | 1 | 2 | 1 | 11  | 3 |
| 1 | 0 | 1 | 0 | 2 | 2 | 00* | 0 |
| 1 | 0 | 1 | 1 | 2 | 3 | 01* | 1 |
| 1 | 1 | 0 | 0 | 3 | 0 | 11  | 3 |
| 1 | 1 | 0 | 1 | 3 | 1 | 00* | 0 |
| 1 | 1 | 1 | 0 | 3 | 2 | 01* | 1 |
| 1 | 1 | 1 | 1 | 3 | 3 | 10* | 2 |

Each output value in the "A+B" column of Table 2 indicated with an asterisk denotes a carry condition where a logical one has conceptually carried into the next-higher-order bit (the bit position corresponding to a decimal value of four).

N-NARY Logic

The N-NARY logic family supports a variety of signal encodings, including 1-of-4. The N-NARY logic family is described in a copending patent application, U.S. patent application Ser. No. 09/019,355, filed Feb. 5, 1998, now U.S. Pat. No. 6,066,965, and titled "Method and Apparatus for a N-NARY logic Circuit Using 1-of-4 Encoding", which is incorporated herein for all purposes and is hereinafter referred to as "The N-NARY Patent." In 1-of-4 encoding, four wires are used to indicate one of four possible values. In contrast, traditional static design uses two wires to indicate four values, as is demonstrated in Table 2. In Table 2, the $A_0$ and $A_1$ wires are used to indicate the four possible values for operand A: 00, 01, 10, and 11. The two B wires are similarly used to indicate the same four possible values for operand B. "Traditional" dual-rail dynamic logic also uses four wires to represent two bits, but two wires are always asserted. In contrast, N-NARY logic asserts only one wire. The benefits of N-NARY logic over dual-rail logic, which include reduced power and reduced noise, are apparent from a reading of The N-NARY Patent.

All signals in N-NARY logic, including 1-of-4, are of the 1-of-N form where N is any integer greater than one. A 1-of-4 signal requires four wires to encode four values (0–3 inclusive), or the equivalent of two bits of information. More than one wire will never be asserted for a 1-of-N signal. Similarly, N-NARY logic requires that a high voltage be asserted for all values, even 0. As illustrated in this specification and more thoroughly discussed in the N-NARY Patent, a 1 of N signal is used to convey multiple values of information in an integrated circuit. The 1 of N signal can convey information to and from an N-NARY logic circuit where an N-NARY logic circuit comprises a shared logic tree circuit that evaluates one or more 1 of N input signals and produces a 1 of N output signal. A single 1 of N signal comprises a bundle of N wires routed together between different cells (or different logic circuits) within a semiconductor device. A 1 of N signal uses a 1 of N encoding to indicate multiple values of information conveyed by the bundle of wires of the 1 of N signal where at most one and only one wire of the bundle of wires of the 1 of N signal is true during an evaluation cycle. The present invention further provides that the bundle of N wires may comprise a number of wires from the following group: a bundle of 3 wires, a bundle of 4 wires, a bundle of 8 wires, or a bundle of N wires. Additionally, the present invention may comprise a not valid value where zero wires of the bundle of N wires is active. Further, the present invention provides that the 1 of N encoding on the bundle of N wires cooperatively operate to reduce the power consumption in the integrated circuit according to the number of wires in the bundle of N wires evaluating per bit of encoded information.

Any one N-NARY gate may comprise multiple inputs and/or outputs. In such a case, a variety of different N-NARY encodings may be employed. For instance, consider a gate that comprises two inputs and two outputs, where the inputs are a 1-of-4 signal and a 1-of-2 signal and the outputs comprise a 1-of-4 signal and a 1-of-3 signal. Various variables, including P, Q, R, and S, may be used to describe the encoding for these inputs and outputs. One may say that one input comprises 1-of-P encoding and the other comprises 1-of-Q encoding, wherein P equals two and Q equals four. Similarly, the variables R and S may be used to describe the outputs. One might say that one output comprises 1-of-R encoding and the other output comprises 1-of-S encoding, wherein R equals four and S equals 3. Through the use of these, and other, additional variables, it is possible to describe multiple N-NARY signals that comprise a variety of different encodings.

SUMMARY OF THE INVENTION

The present invention uses N-NARY logic to perform three functions within one gate. Depending on the value of the ADD/SUB selector, two 1-of-4 numbers are either added to produce a 1-of-4 sum or subtracted to produce a 1-of-4 difference. Also, the gate utilizes carry propagate logic to generate a 1-of-3 HPG signal to indicate whether a carry (or borrow, for subtraction) will halt, generate, or propagate. The preferred embodiment of the present invention implements subtraction by adding the three's complement of the first input, A, to the second input, B, producing a value for B−A in a pre-correction format. In an alternative embodiment, four's complement addition is implemented to achieve the subtract function.

DETAILED DESCRIPTION OF THE INVENTION

Figure 1:
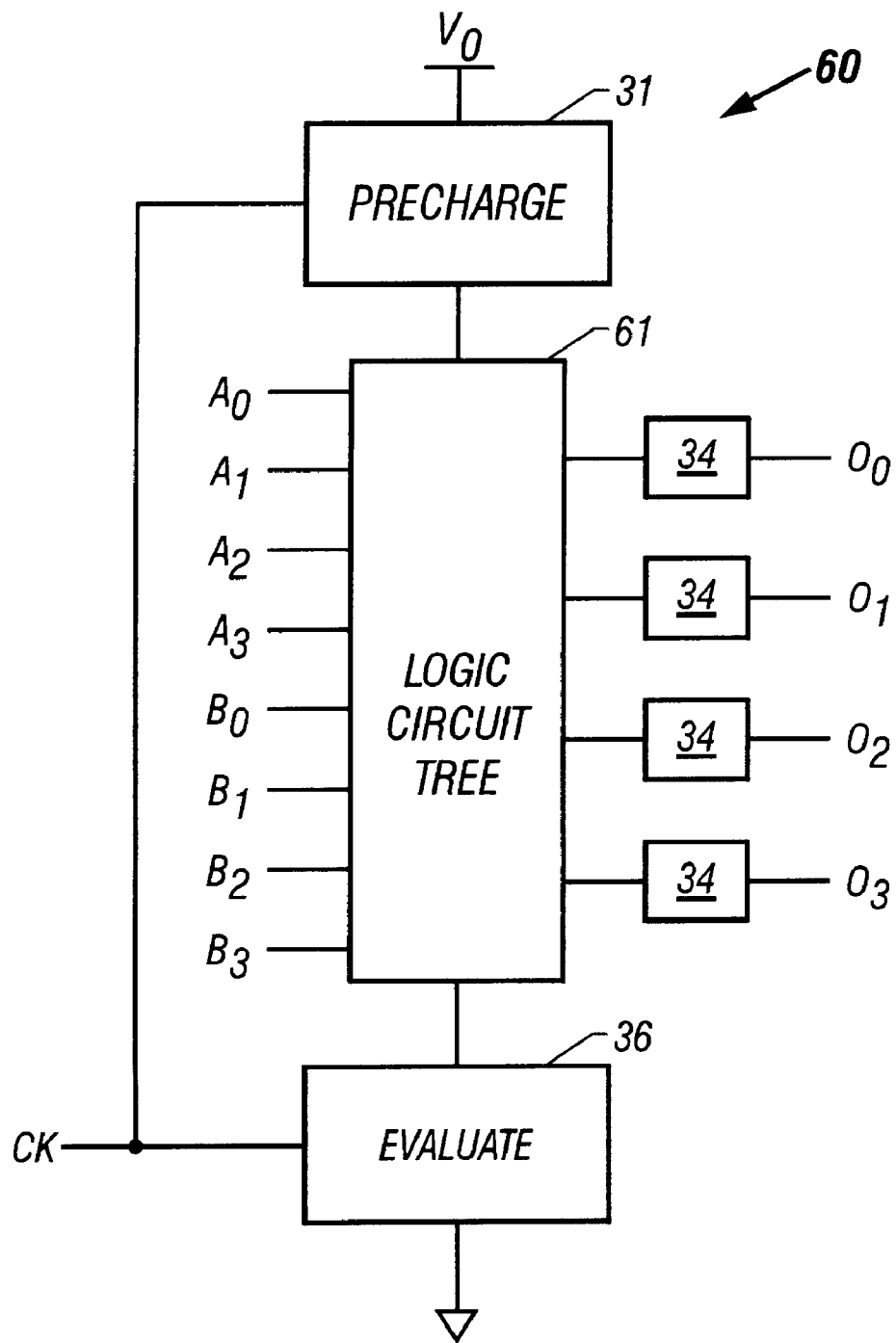
FIG. 1 is a block diagram of an N-NARY gate.

The present invention relates to a logic gate that adds two input values to produce both a sum and a carry propagate indicator using N-NARY logic. The gate has a selectable subtract mode that produces a difference and a borrow/carry propagate indicator for the two input values. This disclosure describes numerous specific details that include specific formats, structures, circuits, and logic functions in order to provide a thorough understanding of the present invention. One skilled in the art will appreciate that one may practice the present invention without these specific details. Additionally, this disclosure does not describe in detail some well-known structures such as N-FETs, P-FETs, nor does it describe N-NARY logic in detail, in order not to obscure the present invention.

N-NARY Addition Logic

The present invention implements addition and subtraction using N-NARY logic. A truth table demonstrating the add operation using 1-of-4 encoding is set forth in Table 3. Each of the 1-of-4 inputs, A and B, in Table 3 is a two-bit input that can represent one of four values, 0 through 3 inclusive, depending on which of the four wires for each signal is set high. Table 3 discards any potential input value that includes more than one wire asserted for each 1-of-4 signal, such as 1111 and 0101. Such values are undefined for the evaluate stage of 1-of-4 logic gates. The four wires for the two-bit sum of the 1-of-4 addition operation in Table 3 are labeled $S_3$, $S_2$, $S_1$, and $S_0$.

TABLE 3

| $A_3$ | $A_2$ | $A_1$ | $A_0$ | A Dec. Value | $B_3$ | $B_2$ | $B_1$ | $B_0$ | B Dec. Value | $S_3$ | $S_2$ | $S_1$ | $S_0$ | Output Decimal Value |
|---|---|---|---|---|---|---|---|---|---|---|---|---|---|---|
| 0 | 0 | 0 | 1 | 0 | 0 | 0 | 0 | 1 | 0 | 0 | 0 | 0 | 1 | 0 |
| 0 | 0 | 0 | 1 | 0 | 0 | 0 | 1 | 0 | 1 | 0 | 0 | 1 | 0 | 1 |
| 0 | 0 | 0 | 1 | 0 | 0 | 1 | 0 | 0 | 2 | 0 | 1 | 0 | 0 | 2 |
| 0 | 0 | 0 | 1 | 0 | 1 | 0 | 0 | 0 | 3 | 1 | 0 | 0 | 0 | 3 |
| 0 | 0 | 1 | 0 | 1 | 0 | 0 | 0 | 1 | 0 | 0 | 0 | 1 | 0 | 1 |
| 0 | 0 | 1 | 0 | 1 | 0 | 0 | 1 | 0 | 1 | 0 | 1 | 0 | 0 | 2 |
| 0 | 0 | 1 | 0 | 1 | 0 | 1 | 0 | 0 | 2 | 1 | 0 | 0 | 0 | 3 |
| 0 | 0 | 1 | 0 | 1 | 1 | 0 | 0 | 0 | 3 | 0 | 0 | 0 | 1 | 0* |
| 0 | 1 | 0 | 0 | 2 | 0 | 0 | 0 | 1 | 0 | 0 | 1 | 0 | 0 | 2 |
| 0 | 1 | 0 | 0 | 2 | 0 | 0 | 1 | 0 | 1 | 1 | 0 | 0 | 0 | 3 |
| 0 | 1 | 0 | 0 | 2 | 0 | 1 | 0 | 0 | 2 | 0 | 0 | 0 | 1 | 0* |
| 0 | 1 | 0 | 0 | 2 | 1 | 0 | 0 | 0 | 3 | 0 | 0 | 1 | 0 | 1* |
| 1 | 0 | 0 | 0 | 3 | 0 | 0 | 0 | 1 | 0 | 1 | 0 | 0 | 0 | 3 |
| 1 | 0 | 0 | 0 | 3 | 0 | 0 | 1 | 0 | 1 | 0 | 0 | 0 | 1 | 0* |
| 1 | 0 | 0 | 0 | 3 | 0 | 1 | 0 | 0 | 2 | 0 | 0 | 1 | 0 | 1* |
| 1 | 0 | 0 | 0 | 3 | 1 | 0 | 0 | 0 | 3 | 0 | 1 | 0 | 0 | 2* |

In Table 3, output values with asterisks indicate that a carry is conceptually generated into a higher-order bit representing a decimal value of 4.

N-NARY Logic Circuits

N-NARY logic may be used to create circuits to perform a desired function. The present invention utilizes N-NARY logic in the preferred embodiment of a combined sum/carry-lookahead adder/subtractor gate.

A background discussion of N-NARY circuits is in order before discussing the combined sum/carry-lookahead adder/subtractor gate of the present invention. FIG. 1 illustrates a 1-of-N logic gate 60 that uses two sets of 1-of-N signals for the inputs and produces one 1-of-N signal for the output. In gate 60, the A and B inputs comprise four wires each, with each set of wires representing 2 bits (one dit) of data. A is a one-dit input, B is a one-dit input, and 0 is a one-dit output. In other words, the N-NARY gate 60 depicted in FIG. 1 comprises 4 input bits (2 dits) and 2 output bits (one dit).

Figure 2:
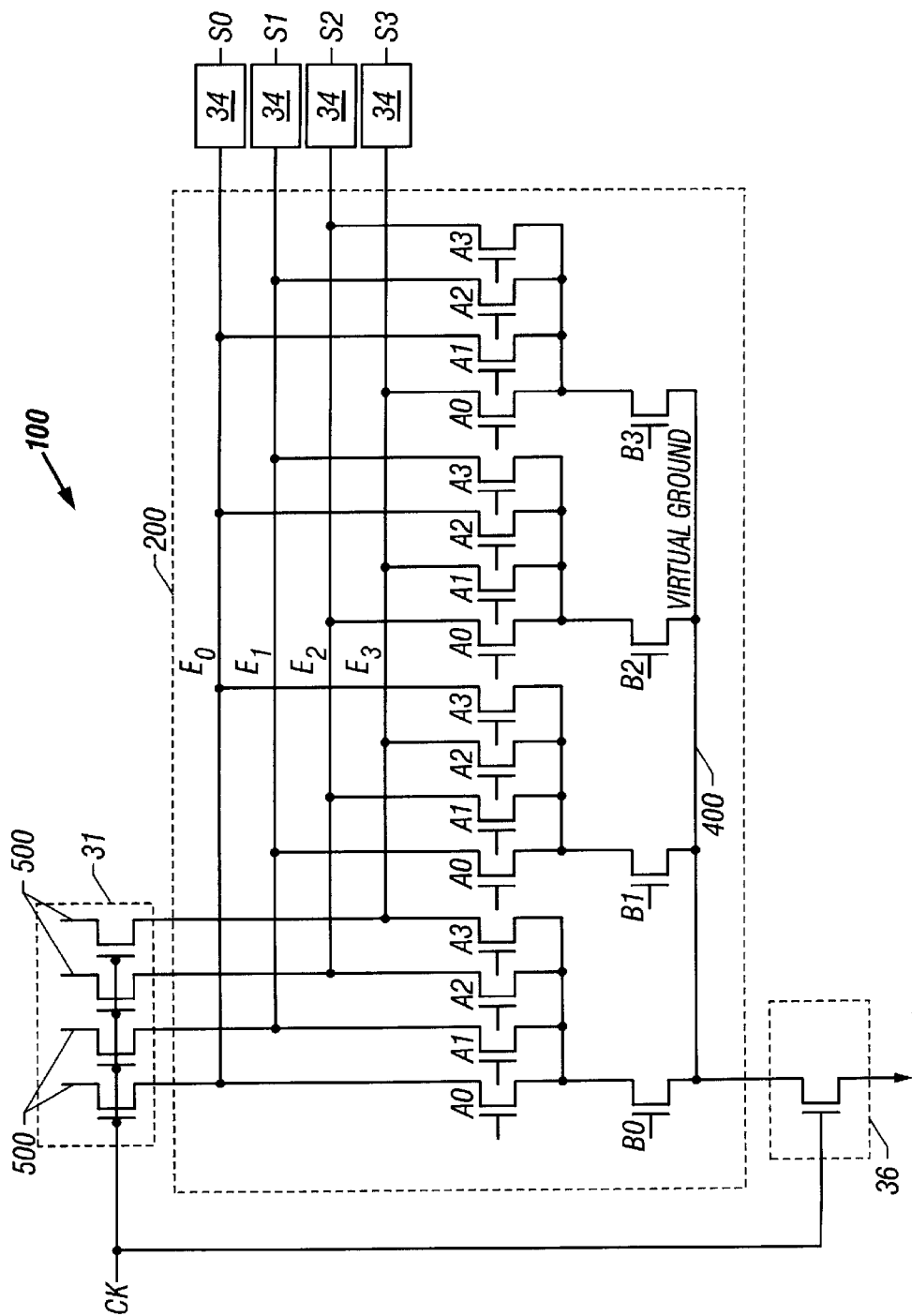
FIG. 2 is an illustration of an N-NARY adder gate.

Referring to FIG. 1, each N-NARY dit logic circuit 60 comprises a logic tree circuit 61, a precharge circuit 31, and an evaluate circuit 36. The logic tree circuit 61 performs a logic function on the two 1-of-4 input signals that could comprise a variety of functions, for example, the Boolean logic functions AND/NAND and OR/NOR, or the more complex combined carry-lookahead/addition/subtraction function of the present invention. The logic gates of the N-NARY family are clocked pre-charge (CP) gates. FIG. 2 illustrates that each input into the logic tree circuit 61 is coupled to at least one N-channel field effect transistor (NFET) $A_0$–$A_3$, $B_0$–$B_3$. Referring back to FIG. 1, the logic tree circuit 61 therefore comprises one or more N-channel FETS. Coupled to the wires of the 1-of-4 output signal are the output buffers 34 that aid in driving additional circuits that couple to the output signal. The preferred embodiment of the present invention uses a circuit with an inverting function as the output buffer 34.

Referring again to FIG. 1, a precharge circuit 31 couples to the logic tree circuit 61 and precharges the dynamic logic of the logic tree circuit 61. The precharge circuit 31 comprises one or more FETs with the preferred embodiment of the circuit comprising P-channel FETs (PFETs). Each evaluation path of the logic tree circuit 61 has its own precharge PFET, shown as 500 in FIG. 2. The PFETs 500 of the precharge circuit 31 quickly and fully precharge all of the dynamic logic in the logic tree circuit 61 during the precharge phase of the clock cycle.

FIG. 2 is a diagram of an N-NARY adder gate. FIG. 2 illustrates that the precharge PFET 500 for an evaluation node E of an N-NARY circuit is connected to positive high voltage, Vcc, and is used to create conductive paths between the evaluation node E and Vcc. Each precharge PFET 500 is coupled to an input, the pre-charge signal. When the precharge signal for any evaluate node has a low voltage, then there is a conductive path between Vcc and the evaluation node E. Coupled to the precharge circuit 31 is the clock signal CK. A low clock signal on CK will cause the FETs in the logic tree circuit 32 to charge when using P-channel FETs in the precharge circuit 31.

An evaluate circuit 36 couples to the logic tree circuit 61 and controls the evaluation of the logic tree circuit 61. The evaluate circuit 36 comprises one or more FETs connected to the CK signal, with the preferred embodiment of the evaluate circuit comprising a single N-channel FET. The single N-FET acts as an evaluation transistor that is used to control when the gate is sensitive to inputs, helps avoid races between other devices, and prevents excessive power consumption. During the precharge phase, the evaluate circuit 36 receives a low value so that no path to Vss may exist through the NFET(s) of the logic tree circuit 61. During the evaluate phase, the evaluate circuit 36 receives a high signal so that a path to Vss through the NFET(s) of the logic tree circuit 61 may exist. Coupled to the evaluate circuit 36 is the clock signal CK. A high clock signal on CK will cause the FETs in the logic tree circuit 61 to evaluate when using N-channel FETs in the evaluate circuit 36. In other words, when the clock signal is high, the evaluate circuit 36 evaluates the logic tree circuit 61.

An evaluate node, E, which comprises the four wires $E_0$, $E_1$, $E_2$, and $E_3$, is the signal pathway between the logic tree circuit 61 and an output buffer 34, and constitutes an evaluation path of the logic tree circuit 61. As stated earlier, each evaluation node wire $E_0$, $E_1$, $E_2$, and $E_3$ has its own precharge PFET. The signal on a particular wire, $E_0$, $E_1$, $E_2$, $E_3$ of the evaluate node E is high, only when there is no connection to Vss through the logic tree circuit 61 NFET(s) associated with that particular wire. If the pre-charge signal is low at time 0 and there is no path to ground through the NFET(s) associated with an evaluate node E of the logic tree circuit 61, then the evaluate node wire E gets pulled to a high voltage. This is called the precharge phase of the gate and we may also say that the gate is in precharge mode. If the precharge signal switches to a high voltage at a later time, the evaluate node E will be floating but the charge left on it will leave the voltage high. This is called the evaluate phase of the gate, and we may also say that the gate is in evaluate mode. If input signals generate a high voltage for any NFET(s) in the logic tree circuit 61 such that a path from the evaluate node E to ground (Vss) exists, then the charge on the evaluate node E will drain to ground, and the evaluate voltage will drop to Vss. If no such path exists, then the evaluate node E will remain at Vcc. When any gate, therefore, switches from precharge mode to evaluate mode, the evaluate node voltage is high, and it either stays high or goes low. Once the evaluate node voltage goes low during the evaluate phase, it cannot be driven high again until the next precharge phase.

Figure 3:
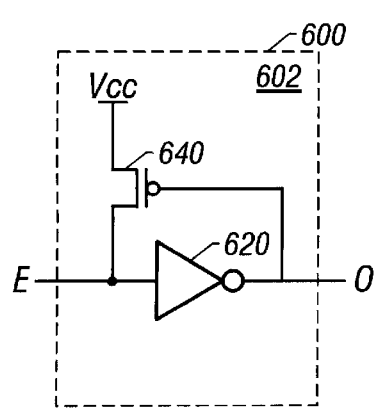
FIG. 3 is a diagram of a first embodiment of an N-NARY output driver circuit.
Figure 4:
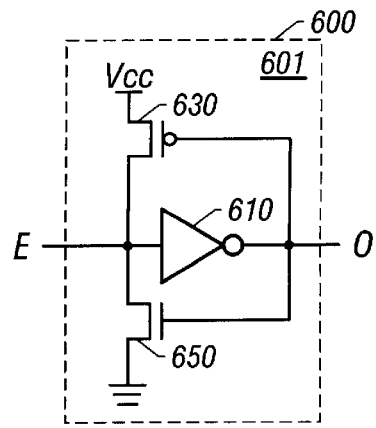
FIG. 4 is a diagram of a second embodiment of an N-NARY output driver circuit.

Each evaluate node wire $E_0$, $E_1$, $E_2$, and $E_3$ couples to an output buffer 34. Two embodiments of the output driver circuit 600 comprising the output buffer 34 are illustrated in FIGS. 3 and 4. FIG. 3 illustrates a half keeper output driver circuit 602 that comprises an inverter 620 and a PFET device 640. FIG. 4 illustrates a full keeper output driver circuit 601 that comprises an inverter 610 coupled to a PFET device 630 and an NFET device 650. Full keeper output driver circuits 601 are only necessary for gates that can be in neither evaluate nor precharge mode for lengthy periods. The flow through the output driver circuit 600 is from evaluate node E to the output signal path 0. The inverter 610, 620 of the output driver circuit 600 is necessary because the evaluate nodes of CP gates of the N-NARY logic family precharge to a high value and evaluate to a low value. The output driver circuit 600 of output buffer 34 holds the value of an evaluate node E during an evaluate phase if the evaluate mode E has not discharged. If the evaluate node E has discharged, then there is a path to ground holding its value low. The output of each evaluate node E will switch from low to high once, at most, during an evaluate phase. The output of each evaluate node E, once coupled to an output driver circuit 600 of output buffer 34, is therefore suitable for feeding a subsequent CP gate.

Figure 5:
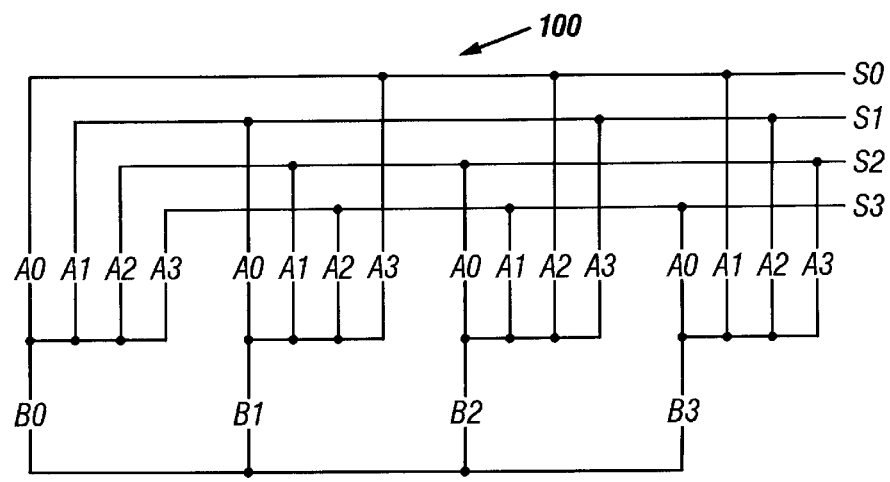
FIG. 5 is a shorthand representation of an N-NARY adder gate having two 1-of-4 inputs.
Figure 8:
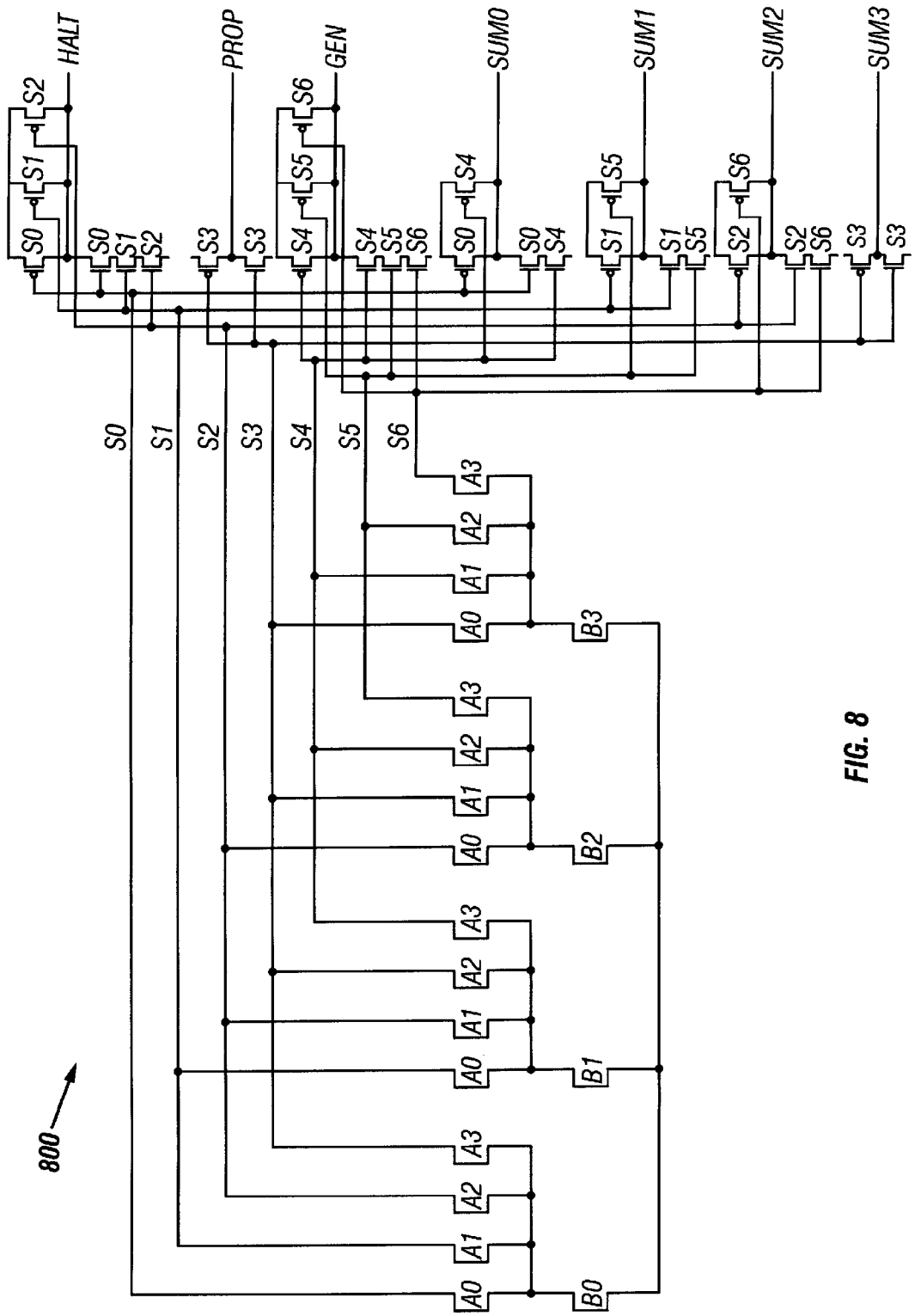
FIG. 8 is a shorthand representation of an N-NARY sum/HPG gate having two 1-of-4 inputs.
Figure 8A:
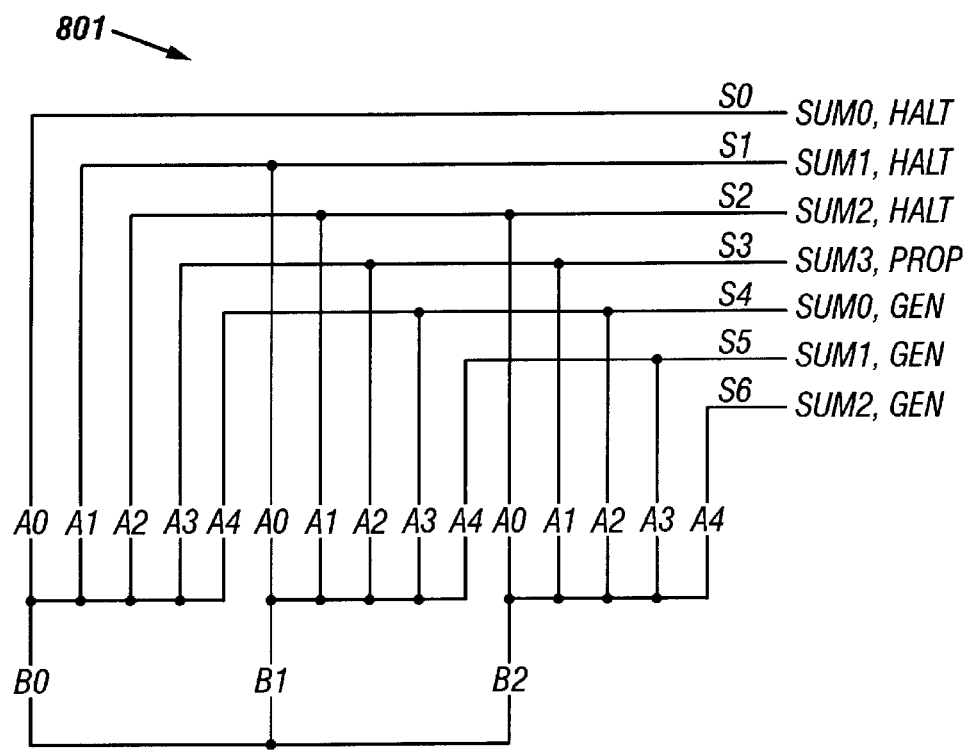
FIG. 8A is a modified shorthand representation of an N-NARY sum/HPG gate having one 1-of-3 addend input and one 1-of-5 addend input.
Figure 9:
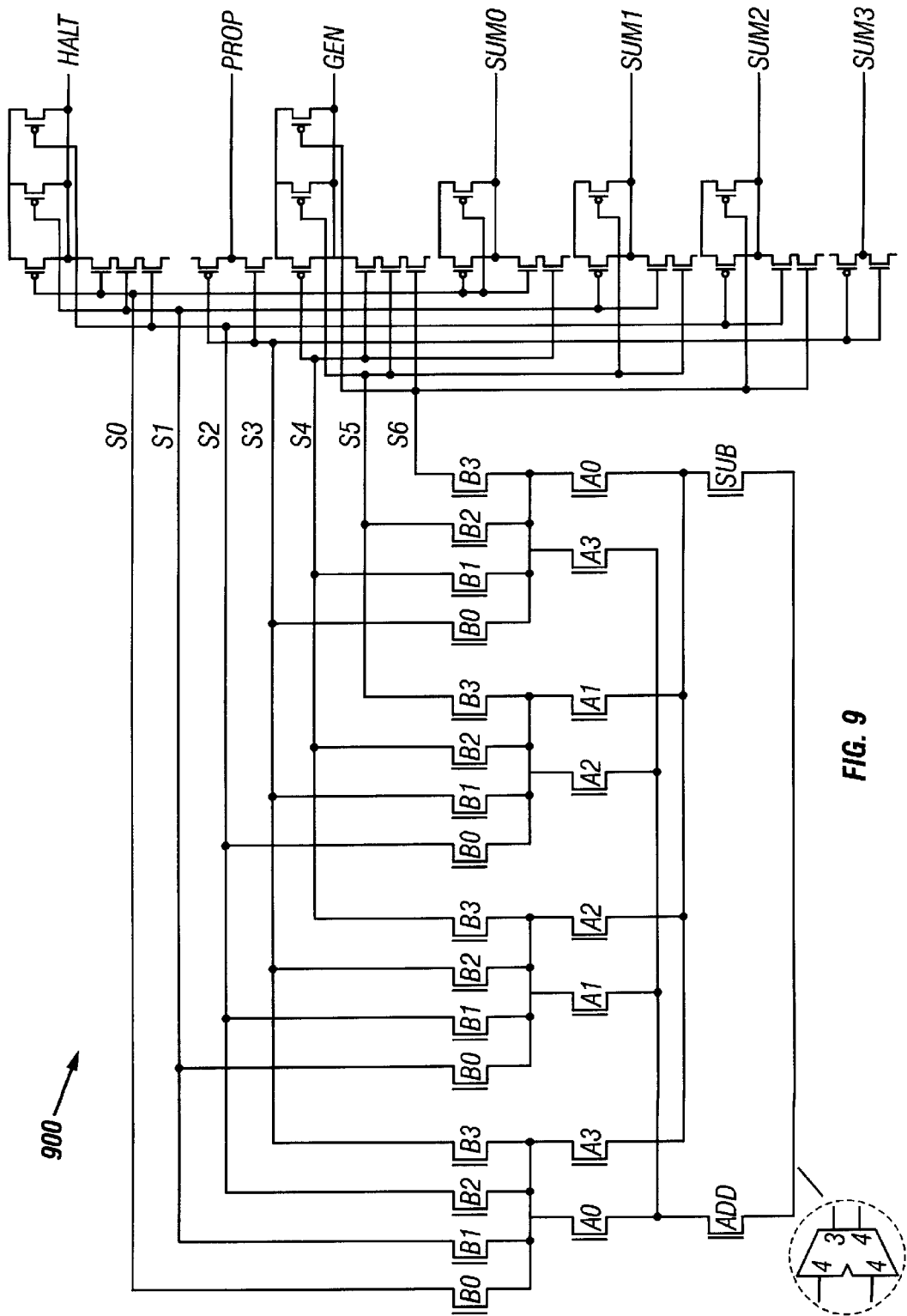
FIG. 9 is a modified shorthand representation of an N-NARY sum/HPG adder/subtractor gate.
Figure 10:
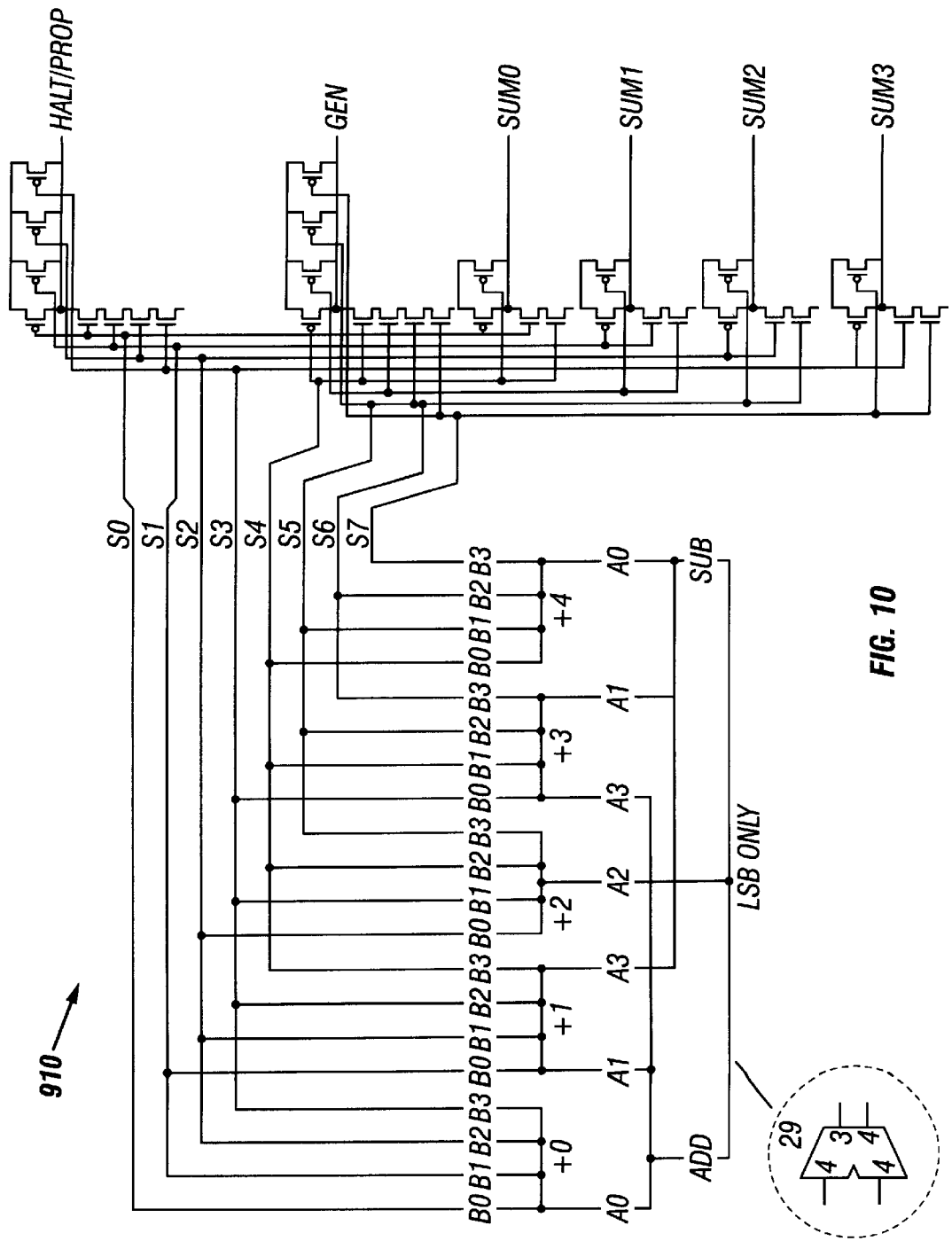
FIG. 10 is a modified shorthand representation of an LSD N-NARY sum/HPG adder/subtractor gate.

A shorthand notation for N-NARY circuit diagrams can be adopted to avoid needless repetition of elements common to all N-NARY circuits. FIG. 2 illustrates these common elements. One common element is the precharge P-FET 500. Precharge P-FETs 500 are required for each evaluate node E in every 1-of-N gate since a single precharge PFET 500 would short each evaluate node E relative to the other evaluate nodes. Since all N-NARY gates require a precharge P-FET 500 for each evaluate node E, the precharge P-FETs 500 may be implied and need not be shown. The same is true for the N-FET associated with each input wire of the A and B inputs. Similarly, each evaluate node E must have its own output buffer 34, which maybe implied. The N-FET associated with the evaluate node 36 may also be implied. Since these features are common to all N-NARY circuits, we may use the shorthand shown in FIG. 5 to represent the N-NARY circuits. Accordingly, FIG. 5 illustrates a shorthand notation of the adder gate depicted in FIG. 2. This shorthand notation is used in FIGS. 5, 5A, 7, 7A and 8A. FIGS. 8, 9 and 10 use a modified shorthand notation in which N-FETs associated with certain inputs are expressly represented, but all other elements discussed herein are implied. In each figure, the elements discussed herein should be implied accordingly.

Figure 6:
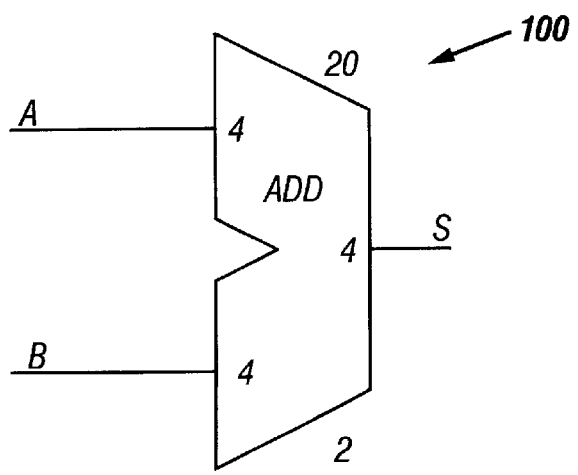
FIG. 6 is a high-level shorthand representation of an N-NARY adder gate.

A further simplification to the representation of the FIG. 2 adder is shown in FIG. 6, where the inputs and outputs are shown as single signals that each can represent one of four signals and each impliedly comprises four wires. The number "4" shown within the add gate of FIG. 6, adjacent to the connections, indicates that each signal can represent one of four values. The number above the gate indicates the number of transistors in the evaluate stack, and the number below the FIG. 6 gate represents the maximum number of transistors in series between the evaluate node and virtual ground. This high-level shorthand is used in FIGS. 6, 9, and 10. In FIGS. 6, 9, and 10 the elements discussed herein should be implied accordingly.

Basic N-NARY Adder Gate

Figure 5A:
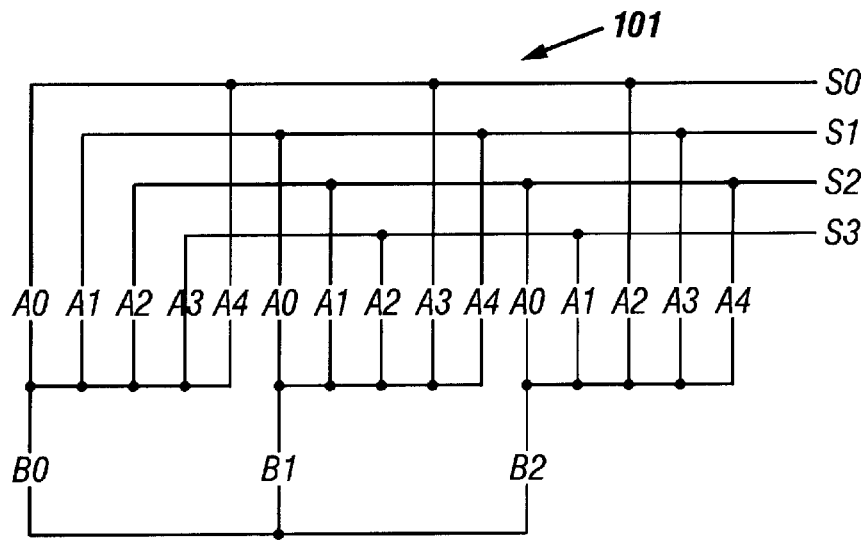
FIG. 5A is a shorthand representation of an N-NARY adder gate having one 1-of-3 input and one 1-of-5 input.

FIG. 5 illustrates an N-NARY adder circuit 100 that uses 1-of-4 logic to perform the addition function on two two-bit 1-of-4 inputs to generate a two-bit 1-of-4 output signal conforming to Table 3. A similar function may be performed with a gate 101 that takes one 1-of-3 input and one 1-of-5 input. Such a gate 101 is illustrated in FIG. 5A.

The function of the adder circuit 100 illustrated in FIG. 5 is to add two 1-of-4 inputs and produce the least significant two bits of the sum, which is also implemented as a 1-of-4 signal. Since the adder circuit 100 operates on two four-value signals it is not appropriate to refer to it as binary. The function of the adder gate 100 is quaternary, rather than binary.

The adder circuit 100 illustrated in FIG. 5 has an A input signal comprising four wires, $A_0$, $A_1$, $A_2$, and $A_3$, and a B input signal comprising four lines, $B_0$, $B_1$, $B_2$, and $B_3$. The A input signal and the B input signal can each represent any integer having a decimal value between zero and three, inclusive. Since N-NARY logic requires that only one of the four wires representing the A input be asserted at any one time, and only one of the B input wires be asserted at one time, it is convenient to treat the A and B signals as individual inputs that each can represent one of four values. The adder circuit 100 therefore has eight inputs: $A_0$, $A_1$, $A_2$, $A_3$, $B_0$, $B_1$, $B_2$, and $B_3$. If the value of A is zero, then the $A_0$ wire is set high and all other A wires, $A_1$, $A_2$, $A_3$, are set low. By the same token, the $B_0$ wire corresponds to zero. Similarly, the $A_1$ wire and $B_1$ wire correspond to the decimal value of one. The $A_2$ wire and $B_2$ wire correspond to the decimal value of two. Finally, the $A_3$ wire and $B_3$ wire correspond to the decimal value of three. The adder circuit 100 illustrated in FIG. 5 performs the following logic functions:

$S_0 = B_0A_0 | B_1A_3 | B_2A_2 | B_3A_1$ (all cases that equal 0 or 4), $S_1 = B_0A_1 | B_1A_0 | B_2A_3 | B_3A_2$ (all cases that equal 1 or 5), $S_2 = B_0A_2 | B_1A_1 | B_2A_0 | B_3A_3$ (all cases that equal 2 or 6), and $S_3 = B_0A_3 | B_1A_2 | B_2A_1 | B_3A_0$ (all cases that equal 3).

Carry Propagate Logic

The adder gate in FIG. 5 is not complete for the purposes of the present invention because it does not provide any information as to whether the sum is too large to represent in two bits of information. In other words, the FIG. 5 adder does not support the carry conditions denoted by asterisks in Table 3. For the addition function of the present invention, what is required is an adder gate that can not only sum two one-dit numbers, but can utilize carry-propagate techniques to account for carry conditions. This is accomplished through the use of carry propagate logic, as described below.

Carry propagate logic takes carry conditions into account. For any two binary numbers A and B, the sum, $S_n$, and the carry, $C_n$, for a given bit position, n, are:

$S_n = A_n \oplus B_n \oplus C_{n-1}$, where $C_{n-1}$ is the carry in from the previous bit, n−1. (1)

$C_n = A_nB_n | A_nC_{n-1} | B_nC_{n-1}$, where $C_{n-1}$ is the carry out from bit n (2)

The truth tables for Equation 1 and Equation 2 are set forth in Table 4.

TABLE 4

| $A_n$ | $B_n$ | $C_{n-1}$ | $A_nB_n$ (1) | $A_nC_{n-1}$ (2) | $B_nC_{n-1}$ (3) | $A_n \oplus B_n$ (4) | $S_n = (4) \oplus C_{n-1}$ | $C_n = (1)|(2)|(3)$ |
|---|---|---|---|---|---|---|---|---|
| 0 | 0 | 0 | 0 | 0 | 0 | 0 | 0 | 0 |
| 0 | 0 | 1 | 0 | 0 | 0 | 0 | 1 | 0 |
| 0 | 1 | 0 | 0 | 0 | 0 | 1 | 1 | 0 |
| 0 | 1 | 1 | 0 | 0 | 1 | 1 | 0 | 1 |
| 1 | 0 | 0 | 0 | 0 | 0 | 1 | 1 | 0 |
| 1 | 0 | 1 | 0 | 1 | 0 | 1 | 0 | 1 |
| 1 | 1 | 0 | 1 | 0 | 0 | 0 | 0 | 1 |
| 1 | 1 | 1 | 1 | 1 | 1 | 0 | 1 | 1 |

In formulating carry propagate logic, one must recognize that the critical path in any adder is along the carry chain. The most significant bit of the sum depends not only on the two most significant addend bits, but also the addend bits of every other bit position via the carry chain. Simply allowing carries to ripple from the least significant end would result in a compact but very slow adder, since the worst-case carry propagation delay would be approximately as many gate delays as the bit width of the adder.

Fast carry-propagate techniques can dramatically decrease the carry propagation delay, and therefore decrease the overall delay of the adder. Adders employing such techniques are sometimes referred to as carry-lookahead adders, or CLAs. Conventional carry propagate adder structures speed up the carry chain by computing the individual carry propagate (P) and carry generate (G) signals for each bit position.

For any two binary numbers A and B, the P and G signals for a given bit position, n, are:

$$P_n = A_n \oplus B_n \qquad (3)$$

$$G_n = A_nB_n. \qquad (4)$$

P and G signals may also be generated for 1-of-4 numbers. G indicates that the given dit position, n, generates a carry that will have to be accounted for in the higher dits of the sum. G will be set when the sum of two 1-of-4 numbers is greater than 3. P indicates that any carry generated in lower dits will propagate across the given dit position, n, to affect the higher dits of the sum. P will be set when the sum of two 1-of-4 numbers is exactly three. If neither G nor P is true for a given dit position, then a carry halt signal (H) is implied. An H signal indicates that any carry generated in lower dits will not propagate across the given dit position, n. H will be set if the sum of two 1-of-4 numbers is less than three. Restated, if the sum of two operand dits in a given dit position is greater than 3, G is true. If the sum is exactly 3, P is true. Otherwise, H is true.

Figure 7:
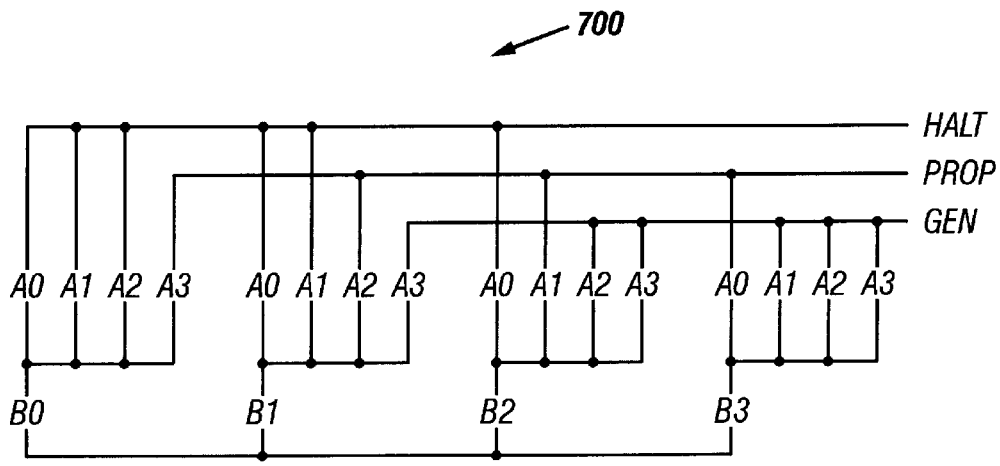
FIG. 7 is a shorthand representation of an N-NARY HPG gate having two 1-of-4 inputs.
Figure 7A:
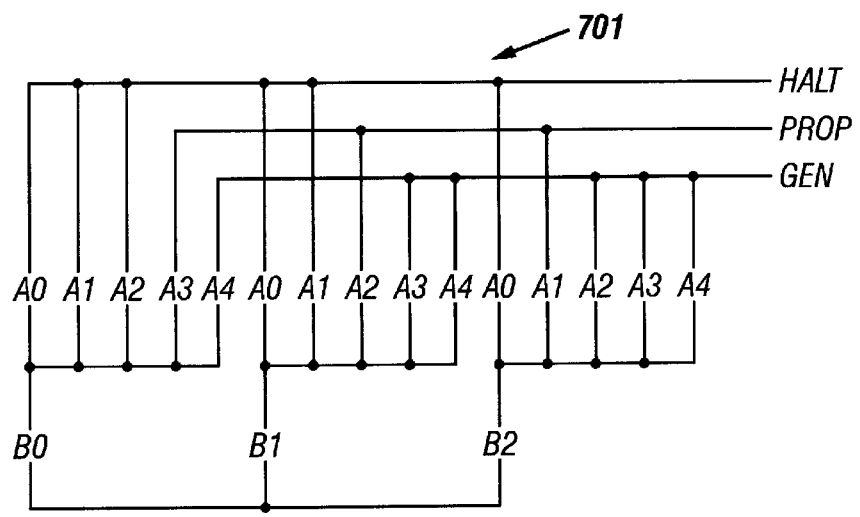
FIG. 7A is a shorthand representation of an N-NARY HPG gate having one 1-of-3 input and one 1-of-5 input.

FIG. 7 illustrates an N-NARY HPG gate 700 that utilizes carry propagate logic to generate an H, P, or G indication for two two-bit 1-of-4 addends. A similar function may be performed using one 1-of-3 addend and one 1-of-5 addend. Such a gate 701 is illustrated in FIG. 7A. The output of the FIG. 7 gate 700 is a 1-of-3 N-NARY signal, such that one, and only one, of the H, P, or G wires is set high during a given evaluate cycle. The output of the HPG gate 700 conforms to Table 5.

TABLE 5

| $A_3$ | $A_2$ | $A_1$ | $A_0$ | A Dec. Value | $B_3$ | $B_2$ | $B_1$ | $B_0$ | B Dec. Value | $P_n$ | $G_n$ | $H_n$ |
|---|---|---|---|---|---|---|---|---|---|---|---|---|
| 0 | 0 | 0 | 1 | 0 | 0 | 0 | 0 | 1 | 0 | 0 | 0 | 1 |
| 0 | 0 | 0 | 1 | 0 | 0 | 0 | 1 | 0 | 1 | 0 | 0 | 1 |
| 0 | 0 | 0 | 1 | 0 | 0 | 1 | 0 | 0 | 2 | 0 | 0 | 1 |
| 0 | 0 | 0 | 1 | 0 | 1 | 0 | 0 | 0 | 3 | 1 | 0 | 0 |
| 0 | 0 | 1 | 0 | 1 | 0 | 0 | 0 | 1 | 0 | 0 | 0 | 1 |
| 0 | 0 | 1 | 0 | 1 | 0 | 0 | 1 | 0 | 1 | 0 | 0 | 1 |
| 0 | 0 | 1 | 0 | 1 | 0 | 1 | 0 | 0 | 2 | 1 | 0 | 0 |
| 0 | 0 | 1 | 0 | 1 | 1 | 0 | 0 | 0 | 3 | 0 | 1 | 0 |
| 0 | 1 | 0 | 0 | 2 | 0 | 0 | 0 | 1 | 0 | 0 | 0 | 1 |
| 0 | 1 | 0 | 0 | 2 | 0 | 0 | 1 | 0 | 1 | 1 | 0 | 0 |
| 0 | 1 | 0 | 0 | 2 | 0 | 1 | 0 | 0 | 2 | 0 | 1 | 0 |
| 0 | 1 | 0 | 0 | 2 | 1 | 0 | 0 | 0 | 3 | 0 | 1 | 0 |
| 1 | 0 | 0 | 0 | 3 | 0 | 0 | 0 | 1 | 0 | 1 | 0 | 0 |
| 1 | 0 | 0 | 0 | 3 | 0 | 0 | 1 | 0 | 1 | 0 | 1 | 0 |
| 1 | 0 | 0 | 0 | 3 | 0 | 1 | 0 | 0 | 2 | 0 | 1 | 0 |
| 1 | 0 | 0 | 0 | 3 | 1 | 0 | 0 | 0 | 3 | 0 | 1 | 0 |

Combined Sum/Carry Propagate Logic

The function of the HPG gate illustrated in FIG. 7 differs from that of the adder gate illustrated in FIG. 5, but the two gates share the same input terms. The present invention combines the function of the adder gate of FIG. 5 and the HPG gate of FIG. 7 to create a combined sum/HPG adder gate. The sum/HPG adder gate of the present invention combines the two functions, as illustrated in FIG. 8, to generate outputs conforming with Table 6.

TABLE 6

| $A_3$ | $A_2$ | $A_1$ | $A_0$ | A Dec. Value | $B_3$ | $B_2$ | $B_1$ | $B_0$ | B Dec. Value | Sum | H | P | G |
|---|---|---|---|---|---|---|---|---|---|---|---|---|---|
| 0 | 0 | 0 | 1 | 0 | 0 | 0 | 0 | 1 | 0 | 0 | 1 | 0 | 0 |
| 0 | 0 | 0 | 1 | 0 | 0 | 0 | 1 | 0 | 1 | 1 | 1 | 0 | 0 |
| 0 | 0 | 0 | 1 | 0 | 0 | 1 | 0 | 0 | 2 | 2 | 1 | 0 | 0 |
| 0 | 0 | 0 | 1 | 0 | 1 | 0 | 0 | 0 | 3 | 3 | 0 | 1 | 0 |
| 0 | 0 | 1 | 0 | 1 | 0 | 0 | 0 | 1 | 0 | 1 | 1 | 0 | 0 |
| 0 | 0 | 1 | 0 | 1 | 0 | 0 | 1 | 0 | 1 | 2 | 1 | 0 | 0 |
| 0 | 0 | 1 | 0 | 1 | 0 | 1 | 0 | 0 | 2 | 3 | 0 | 1 | 0 |
| 0 | 0 | 1 | 0 | 1 | 1 | 0 | 0 | 0 | 3 | 0 | 0 | 0 | 1 |
| 0 | 1 | 0 | 0 | 2 | 0 | 0 | 0 | 1 | 0 | 2 | 1 | 0 | 0 |
| 0 | 1 | 0 | 0 | 2 | 0 | 0 | 1 | 0 | 1 | 3 | 0 | 1 | 0 |
| 0 | 1 | 0 | 0 | 2 | 0 | 1 | 0 | 0 | 2 | 0 | 0 | 0 | 1 |
| 0 | 1 | 0 | 0 | 2 | 1 | 0 | 0 | 0 | 3 | 1 | 0 | 0 | 1 |
| 1 | 0 | 0 | 0 | 3 | 0 | 0 | 0 | 1 | 0 | 3 | 0 | 1 | 0 |
| 1 | 0 | 0 | 0 | 3 | 0 | 0 | 1 | 0 | 1 | 0 | 0 | 0 | 1 |
| 1 | 0 | 0 | 0 | 3 | 0 | 1 | 0 | 0 | 2 | 1 | 0 | 0 | 1 |
| 1 | 0 | 0 | 0 | 3 | 1 | 0 | 0 | 0 | 3 | 2 | 0 | 0 | 1 |

The function of the sum/HPG adder gate illustrated in FIG. 8 is to add two two-bit 1-of-4 inputs and generate the sum and the H, P, and G values set forth in Table 6. The two operands A and B are two-bit 1-of-4 values, as is the sum S. The H, P, and G outputs represent the three wires for a 1-of-3 output. FIG. 8A illustrates a gate 801 that performs a similar function using one 1-of-3 addend and one 1-of-5 addend.

FIG. 8 illustrates that it is not necessary to construct multiple identical output signals from an evaluate node, even though the sum/HPG adder/subtractor gate illustrated in FIG. 8 comprises two output signals. In FIG. 8, the evaluate nodes are identified as S0, S1, S2, S3, S4, S5, and S6. In order for the two different output signals to conform to the 1-of-N signal definition, additional processing is performed on the evaluate nodes. In this processing, each evaluate node S0–S6 drives more than one output, and the outputs are different. FIG. 8 illustrates that for the HALT output, the S0, S1, and S2 evaluate nodes are logically NAND'ed together. The PROP output is pulled high if the S3 evaluate node is asserted. For the GEN output, the S4, S5, and S6 evaluate nodes are logically NAND'ed together. The Sum0 output is pulled high if the S0 or S4 evaluate nodes are asserted. For Sum1, the S1 and S5 evaluate nodes are NAND'ed together. For Sum2, the S2 and S6 evaluate nodes are NAND'ed together. Finally, the Sum3 output is pulled high if the S3 evaluate node is asserted. Because the evaluate nodes are asserted low and the outputs are asserted high, the effect of NANDing is to logically OR the evaluate terms.

N-NARY Subtraction Logic

The present invention possesses selectable subtract capability, and may be used for either addition or subtraction, based on the value of the ADD/SUB selector. A truth table demonstrating the subtraction operation, B–A, using 1-of-4 encoding is set forth in Table 7. Each of the two-bit 1-of-4 inputs, A and B, in Table 3 can represent one of four values, 0 through 3 inclusive, depending on which of the four wires for each signal is set high. The four wires for the two-bit 1-of-4 difference of the subtraction operation in Table 3 are labeled $D_3$, $D_2$, $D_1$, and $D_0$.

TABLE 7

| $B_3$ | $B_2$ | $B_1$ | $B_0$ | B Dec. Value | $A_3$ | $A_2$ | $A_1$ | $A_0$ | A Dec. Value | $D_3$ | $D_2$ | $D_1$ | $D_0$ | B – A Decimal Value |
|---|---|---|---|---|---|---|---|---|---|---|---|---|---|---|
| 0 | 0 | 0 | 1 | 0 | 0 | 0 | 0 | 1 | 0 | 0 | 0 | 0 | 1 | 0 |
| 0 | 0 | 0 | 1 | 0 | 0 | 0 | 1 | 0 | 1 | 0 | 0 | 1 | 0 | −1 |
| 0 | 0 | 0 | 1 | 0 | 0 | 1 | 0 | 0 | 2 | 0 | 1 | 0 | 0 | −2 |
| 0 | 0 | 0 | 1 | 0 | 1 | 0 | 0 | 0 | 3 | 1 | 0 | 0 | 0 | −3 |
| 0 | 0 | 1 | 0 | 1 | 0 | 0 | 0 | 1 | 0 | 0 | 0 | 1 | 0 | 1 |
| 0 | 0 | 1 | 0 | 1 | 0 | 0 | 1 | 0 | 1 | 0 | 0 | 0 | 1 | 0 |
| 0 | 0 | 1 | 0 | 1 | 0 | 1 | 0 | 0 | 2 | 1 | 0 | 0 | 0 | −1 |
| 0 | 0 | 1 | 0 | 1 | 1 | 0 | 0 | 0 | 3 | 0 | 1 | 0 | 0 | −2 |
| 0 | 1 | 0 | 0 | 2 | 0 | 0 | 0 | 1 | 0 | 0 | 1 | 0 | 0 | 2 |
| 0 | 1 | 0 | 0 | 2 | 0 | 0 | 1 | 0 | 1 | 1 | 0 | 0 | 0 | 1 |
| 0 | 1 | 0 | 0 | 2 | 0 | 1 | 0 | 0 | 2 | 0 | 0 | 0 | 1 | 0 |
| 0 | 1 | 0 | 0 | 2 | 1 | 0 | 0 | 0 | 3 | 0 | 0 | 1 | 0 | −1 |
| 1 | 0 | 0 | 0 | 3 | 0 | 0 | 0 | 1 | 0 | 1 | 0 | 0 | 0 | 3 |
| 1 | 0 | 0 | 0 | 3 | 0 | 0 | 1 | 0 | 1 | 0 | 1 | 0 | 0 | 2 |

TABLE 7-continued

| B₃ | B₂ | B₁ | B₀ | B Dec. Value | A₃ | A₂ | A₁ | A₀ | A Dec. Value | D₃ | D₂ | D₁ | D₀ | B - A Decimal Value |
|---|---|---|---|---|---|---|---|---|---|---|---|---|---|---|
| 1 | 0 | 0 | 0 | 3 | 0 | 1 | 0 | 0 | 2 | 0 | 0 | 1 | 0 | 1 |
| 1 | 0 | 0 | 0 | 3 | 1 | 0 | 0 | 0 | 3 | 0 | 0 | 0 | 1 | 0 |

In Table 7, negative output values indicate that a borrow from the next higher-order dit must occur. As is discussed below, the present invention produces output values that are based on the assumption that a borrow will occur in every case. In cases where such a borrow is not necessary, the present invention will generate a carry, which indicates that the final output should be adjusted accordingly.

In performing subtract logic within a processor, it is useful to implement subtraction as a form of complement addition. An adder may be made to subtract by forming the radix complement of the subtrahend and adding it to the minuend, where "radix" refers to the base of the number system being used. The radix complement of a number is formed by adding one to the least significant bit of the diminished-radix complement of the number. The diminished-radix complement is formed by subtracting every digit of the subtrahend from a number y, where y=base−1. In binary systems, subtraction is often implemented using the radix complement, or two's complement. Two's complement is formed by incrementing a one's complement number (the diminished radix complement). One's complement is formed by subtracting each bit of the subtrahend from 1, which is one less than the base (2). Formation of the 1'complement effects an inversion of each digit of the subtrahend.

The preferred embodiment of the present invention, because it operates on 1-of-4 inputs, is not a binary system. Instead, the system is quaternary, with a base of four. Accordingly, the subtraction of the present invention is implemented as a form of four's complement addition. In the present invention, therefore, the subtrahend is converted to three's complement, the diminished radix complement, by subtracting each dit of the subtrahend from three. In an alternative embodiment, the subtrahend is converted from three's complement to four's complement, the radix complement, by incrementing the least significant dit of the three's complement number. This alternative embodiment maybe useful in implementing the least significant dit of a subtraction operation. Table 8 illustrates the three's complement for each of the four possible values of a 1-of-4 dit.

TABLE 8

| x (decimal) | x (1-of-4) | 3's Comp. (3−x) | 3−x (1-of-4) |
|---|---|---|---|
| 0 | 0001 | 3 | 1000 |
| 1 | 0010 | 2 | 0100 |
| 2 | 0100 | 1 | 0010 |
| 3 | 1000 | 0 | 0001 |

Since four's complement is generated by adding one to the least significant dit of a three's complement number, the present invention provides subtraction capability with minimal additional cost by providing a path that converts each dit of the subtrahend to the three's complement. An alternative embodiment of the present invention, useful in implementing the least significant dit of a subtraction operation, not only converts the subtrahend to a three's complement, but also increments it by one to create the four's complement.

Preferred Embodiment—Subtraction using Three's Complement

Table 9 sets forth the truth table for an N-NARY circuit that performs subtraction of two 1-of-4 numbers, A and B, by adding the three's complement of A to B in order derive the two-bit difference of B−A. In Table 9, A and B are represented in both decimal and 1-of-4 representations. The "⁻A" column of Table 9 represents the three's complement value of the subtrahend, A. The "⁻ᴬ (1-of-4)" column represents the three's complement of A in 1-of-4 representation. The "Pre-corr. Diff." column represents the difference of B−A, represented in a pre-correction format discussed in detail below. The "Diff.(Dec.)" column represents the difference in post-correction decimal format.

TABLE 9

| B | B (1-of-4) | A | A (1-of-4) | ⁻A | ⁻A (1-of-4) | Pre-Corr. Diff (B − A) | Diff |
|---|---|---|---|---|---|---|---|
| 0 | 0001 | 0 | 0001 | 3 | 1000 | 3 | 0 |
| 1 | 0010 | 0 | 0001 | 3 | 1000 | 0* | 1 |
| 2 | 0100 | 0 | 0001 | 3 | 1000 | 1* | 2 |
| 3 | 1000 | 0 | 0001 | 3 | 1000 | 2* | 3 |
| 0 | 0001 | 1 | 0010 | 2 | 0100 | 2 | −1 |
| 1 | 0010 | 1 | 0010 | 2 | 0100 | 3 | 0 |
| 2 | 0100 | 1 | 0010 | 2 | 0100 | 0* | 1 |
| 3 | 1000 | 1 | 0010 | 2 | 0100 | 1* | 2 |
| 0 | 0001 | 2 | 0100 | 1 | 0010 | 1 | −2 |
| 1 | 0010 | 2 | 0100 | 1 | 0010 | 2 | −1 |
| 2 | 0100 | 2 | 0100 | 1 | 0010 | 3 | 0 |
| 3 | 1000 | 2 | 0100 | 1 | 0010 | 0* | 1 |
| 0 | 0001 | 3 | 1000 | 0 | 1010 | 0 | −3 |
| 1 | 0010 | 3 | 1000 | 0 | 0001 | 1 | −2 |
| 2 | 0100 | 3 | 1000 | 0 | 0001 | 2 | −1 |
| 3 | 1000 | 3 | 1000 | 0 | 0001 | 3 | 0 |

The values in the "Diff" column of Table 9 denoted by asterisks are mod 4 values of a difference that is too large to be represented in two bits. Conceptually, these cases generate a carry into the next higher-order dit, where such carry represents a value of four.

Pre-correction Format for Three's Complement Subtraction

The values set forth in the "Pre-Corr. Diff" column of Table 9 represent the present invention's pre-correction format for three's complement subtraction. Rather than producing an intermediate difference ("Diff") value that represents B−A for a given bit n, the format of the Diff in Table 9 is: $(b-1)+B_n-A_n$, where b is the base. In the preferred embodiment of the present invention, the base is four. Such format is based on the following two assumptions.

Assumptions

I) a borrow from dit×by the dit of next-lowest significance is implied for each dit except the least significant dit of the intermediate difference; and II) every dit×will require a borrow from the dit of next-higher significance.

Considering the first assumption in isolation, the borrow associated with Assumption I results in 1 being subtracted ("borrowed") from dit n. This first borrow conceptually adds the base to dit n−1. The first assumption therefore results in subtraction of 1 from the intermediate difference for dit n, providing a pre-correction format of (−1)+($B_n$−$A_n$). The latter assumption results in the base, b, being subtracted ("borrowed") from dit n+1 and added to dit n. Combining the second assumption with the first, the pre-correction format of the present invention therefore becomes (b−1)+ ($B_n$−$A_n$). The "Diff" column of Table 9 illustrates that the output of the present invention conforms to this pre-correction format.

Alternative Embodiment—Subtraction using Four's Complement

Table 9(b) sets forth the truth table for an N-NARY circuit that performs subtraction of two 1-of-4 numbers, A and B, by adding the four's complement of A to B in order derive the two-bit difference of B−A. In Table 9(b), A and B are represented in both decimal and 1-of-4 representations. The "~A" column of Table 9(b) represents the three's complement value of the subtrahend, A, and the "~A+1" column represents the four's complement value of A. The "~A+1(1-of-4)" column represents the four's complement of A in 1-of-4 representation. The "Pre-corr. Diff." column represents the difference of B−A, represented in a pre-correction format discussed in detail below.

TABLE 9

| B | B (1-of-4) | A | A (1-of-4) | ~A | ~A + 1 | ~A + 1 (1-of-4) | Pre-Corr. Diff (B − A) | Diff |
|---|---|---|---|---|---|---|---|---|
| 0 | 0001 | 0 | 0001 | 3 | 4 | 0001* | 0* | 0 |
| 1 | 0010 | 0 | 0001 | 3 | 4 | 0001* | 1* | 1 |
| 2 | 0100 | 0 | 0001 | 3 | 4 | 0001* | 2* | 2 |
| 3 | 1000 | 0 | 0001 | 3 | 4 | 0001* | 3* | 3 |
| 0 | 0001 | 1 | 0010 | 2 | 3 | 1000 | 3 | −1 |
| 1 | 0010 | 1 | 0010 | 2 | 3 | 1000 | 0* | 0 |
| 2 | 0100 | 1 | 0010 | 2 | 3 | 1000 | 1* | 1 |
| 3 | 1000 | 1 | 0010 | 2 | 3 | 1000 | 2* | 2 |
| 0 | 0001 | 2 | 0100 | 1 | 2 | 0100 | 2 | −2 |
| 1 | 0010 | 2 | 0100 | 1 | 2 | 0100 | 3 | −1 |
| 2 | 0100 | 2 | 0100 | 1 | 2 | 0100 | 0* | 0 |
| 3 | 1000 | 2 | 0100 | 1 | 2 | 0100 | 1* | 1 |
| 0 | 0001 | 3 | 1000 | 0 | 1 | 0010 | 1 | −3 |
| 1 | 0010 | 3 | 1000 | 0 | 1 | 0010 | 2 | −2 |
| 2 | 0100 | 3 | 1000 | 0 | 1 | 0010 | 3 | −1 |
| 3 | 1000 | 3 | 1000 | 0 | 1 | 0010 | 0* | 0 |

The values in the "Pre-Corr. Diff" and "~A+1" columns denoted by asterisks are mod 4 values of a difference that is too large to be represented in two bits. Conceptually, these cases generate a carry into the next higher-order dit, where such carry represents a value of four.

Pre-correction Format for Four's Complement Subtraction

The values set forth in the "Pre-Corr. Diff" column of Table 9(b) represent the present invention's pre-correction format for four's complement subtraction. In contrast to three's complement subtraction, the alternative embodiment of the present invention that performs four's complement subtraction assumes that the alternative embodiment will be used to implement the least significant dit (LSD) of the subtraction operation. Since there will never be a borrow out of the LSD by a less significant dit, the four's complement embodiment of the present invention only implements Assumption II listed above, and not Assumption I. Assumption II results in the base, b, being subtracted ("borrowed") from dit n+1 and added to dit n. The pre-correction format for the intermediate difference, represented in the "Pre-Corr. Diff" column of Table 9(b), is therefore b+$B_n$−$A_n$, where b is the base. Table 9(b) illustrates that the output of the alternative embodiment of the present invention conforms to this pre-correction format.

Borrow Propagate Logic

During subtraction, the present invention generates a H(alt), P(ropagate), and G(enerate) signal for each dit in addition to the intermediate difference in the pre-correction formats discussed above. In order to understand the present invention's operation regarding the setting of the H, P, and G signals, it is useful to keep in mind the various conceptual transfers of data that may occur during a subtract operation. Example 1 sets forth these conceptual transfers among three dits in a subtract operation, the LSD, dit n, and dit n+1.

EXAMPLE 1

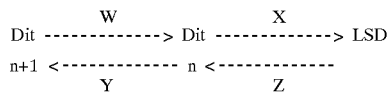

In Example 1, W represents a borrow from Dit n+1 into Dit n. Such borrow will conceptually subtract one from the value of Dit n+1 and will conceptually add a value equal to the base (in this case, four) to the value of Dit n. The borrow depicted by W in Example 1 illustrates the application of Assumption I discussed above to Dit n+1. Likewise, data transfer W also illustrates the application of Assumption II to Dit n. Similarly, X represents a borrow from Dit n into the LSD. Data transfer X therefore represents the application of Assumption I to Dit n and the application of Assumption II to the LSD.

Still referring to Example 1, data transfer Y represents a carry from Dit n into Dit n+1. Such carry will decrement the base (four) from the value of Dit n and will add one to Dit n+1. The carry represented in Y will occur whenever the intermediate difference for Dit n is too large to be represented with two bits. Similarly, Z represents a carry from the LSD into Dit n.

Example 1 also illustrates that there will never be a borrow out of the LSD because there is no dit to the right of the LSD. This is the reason that the four's-complement alternative embodiment of the present invention applies only Assumption II, and not Assumption I, to generate the four's complement pre-correction format.

Keeping the foregoing assumptions and data transfers in mind, we now turn to the present invention's setting of the H, P, and G indicators for subtract operations. In the subtraction operation of the present invention, an H signal relates to the concept of "borrowing." A borrow is the complement of a generate associated with addition. Conceptually, the action of a borrow from dit n is to decrement the value of the intermediate difference for dit n in the final level of logic in a subtractor, after all borrows have been propagated—just as a G signal that propagates to a given dit position in addition will increment the value of the sum for dit n.

Regarding the H Signal, it is important to note that, as stated in Assumption II above, the present invention assumes that the intermediate difference generated for any dit n will be incremented via a borrow. In other words, there is an implied assumption that there will be a borrow by dit n from the dit of next-higher significance (n+1). Assumption II therefore assumes that the data transfer denoted by W in Example 1 will always occur. Accordingly, the intermediate difference for dit n created by the present invention contains an "implied borrow." The H(alt) signal associated with the subtraction operation on dit n simply means that, for a dit n, the implied borrow out of the dit of next-higher significance (n+1) will indeed take place as assumed. The H signal will be set when the intermediate sum of dit n is a negative number, indicating that a borrow must occur. H will be set when $B_n<A_n$.

A G signal in subtraction corrects the implied borrow described above, if the borrow was unnecessary, by indicating that the intermediate difference for dit n should be incremented by one. In other words, a G signal indicates that the carry denoted by Y in Example 1 should occur to offset the unnecessary implied borrow denoted by data transfer by W in Example 1. For elaboration, consider the example set forth in Table 10 below. Table 10 shows two consecutive dits in a subtract operation, the LSD and the dit of next-higher significance, dit n. The value of $B_{LSD}$ is 3, the value of $B_n$ is 1, the value of $A_{LSD}$ is 1, and the value of $A_n$ is 2.

TABLE 10

|  | Step 1 | | Step 2 | | Step 3 | | Step 4 | | Step 5 | |
| --- | --- | --- | --- | --- | --- | --- | --- | --- | --- | --- |
|  | n | LSD | n | LSD | n | LSD | n | LSD | n | LSD |
| B | 1 | 3 | 11 | 3 | 10 | 13 | 10 | 13 | 12 | 13 |
| −A | 2 | 1 | 2 | 1 | 2 | 1 | 2 | 1 | 1 | 1 |
| Int. Diff. | — | | — | | — | | 2 | 12 | 3 | 2 |

The first step of Table 10 shows the two dits to be subtracted. Step 2 illustrates the borrow into dit n from the next-higher dit, dit n+1 (not shown), which results in a value of 11 for $B_n$. The value of 11 is the base four representation of 5 (i.e., 5 MOD 4), and 5 is the result of adding the borrowed four to the original value (1) of $B_n$. Step 2 therefore corresponds to the application of Assumption II to dit n, which is depicted as data transfer W in Example 1. Step 2 also corresponds to the application of Assumption I to dit n+1, which is not shown in Table 10 but is depicted as data transfer W in Example 1.

The third step of Table 10 illustrates the borrow into the LSD from dit n and shows that such borrow has two effects. First, the borrow decrements one from $B_n$, resulting in a value of 10 for $B_n$. This first effect corresponds to the application of Assumption I to dit n. Second, the borrow illustrated in Step 3 also results in the addition of four to the original value of $B_{LSD}$ (3), with a resultant value of 7, which has a base four representation of 13. This second effect corresponds to the application of Assumption II to the LSD. Both effects are illustrated by data transfer X in Example 1.

The fourth step of Table 10 illustrates the result of ditwise subtraction on dit n and the LSD after the borrow assumptions have been applied. The intermediate difference for the LSD generates a carry because the result of the subtraction results in a value for the LSD that is greater than the base. The intermediate difference for the LSD is 12, which is the base four representation of 6.

Step 5 illustrates the carry from the LSD back into dit n. This carry corresponds to data transfer Z shown in Example 1. This carry will correct the initial borrow out of dit n that was illustrated in Step 1, and depicted as data transfer X in Example 1. In Step 5, the carry results in 1) the intermediate difference for dit n being incremented by one and; 2) the intermediate difference for the LSD being decremented by four, which is the base. The borrow from dit n into the LSD is unnecessary any time that $B_n>A_n$. Accordingly, the present invention sets the G bit to generate a carry any time $B_n>A_n$, thereby correcting unnecessary Assumption I borrows.

The P signal, for subtraction, indicates that the determination of whether or not a borrow must be generated out of dit n depends on whether there is a borrow into dit n. This function is very similar to the P signal for addition, in that a P for subtraction indicates that a borrow will propagate across dit n. P will be set when $B_n=A_n$.

The state of the H, P, and G output bit for each combination of inputs into the preferred embodiment of the present invention is set forth in Table 11.

TABLE 11

| B | B (1-of-4) | A | A (1-of-4) | ¯A | ¯A (1-of-4) | Pre-Corr. Diff (B − A) | Diff | H $B_n < A_n$ | P $B_n = A_n$ | G $B_n > A_n$ |
| --- | --- | --- | --- | --- | --- | --- | --- | --- | --- | --- |
| 0 | 1000 | 0 | 1000 | 3 | 0001 | 3 | 0 | 0 | 1 | 0 |
| 1 | 0100 | 0 | 1000 | 3 | 0001 | 0 | 1 | 0 | 0 | 1 |
| 2 | 0010 | 0 | 1000 | 3 | 0001 | 1 | 2 | 0 | 0 | 1 |
| 3 | 0001 | 0 | 1000 | 3 | 0001 | 2 | 3 | 0 | 0 | 1 |
| 0 | 1000 | 1 | 0100 | 2 | 0010 | 2 | −1 | 1 | 0 | 0 |
| 1 | 0100 | 1 | 0100 | 2 | 0010 | 3 | 0 | 0 | 1 | 0 |
| 2 | 0010 | 1 | 0100 | 2 | 0010 | 0 | 1 | 0 | 0 | 1 |
| 3 | 0001 | 1 | 0100 | 2 | 0010 | 1 | 2 | 0 | 0 | 1 |
| 0 | 1000 | 2 | 0010 | 1 | 0100 | 1 | −2 | 1 | 0 | 0 |
| 1 | 0100 | 2 | 0010 | 1 | 0100 | 2 | −1 | 1 | 0 | 0 |
| 2 | 0010 | 2 | 0010 | 1 | 0100 | 3 | 0 | 0 | 1 | 0 |
| 3 | 0001 | 2 | 0010 | 1 | 0100 | 0 | 1 | 0 | 0 | 1 |
| 0 | 1000 | 3 | 0001 | 0 | 1000 | 0 | −3 | 1 | 0 | 0 |
| 1 | 0100 | 3 | 0001 | 0 | 1000 | 1 | −2 | 1 | 0 | 0 |
| 2 | 0010 | 3 | 0001 | 0 | 1000 | 2 | −1 | 1 | 0 | 0 |
| 3 | 0001 | 3 | 0001 | 0 | 1000 | 3 | 0 | 0 | 1 | 0 |

It is apparent from Table 11 that the H signal is set for each situation where $B_n<A_n$, so that every instance where the "Diff" column of Table 11 shows a negative number, a borrow is indicated because the H bit is set for that row. Table 11 also shows that any time the "Pre-corr. Diff" column of Table 9 indicates a carry, the G bit is set in Table 11 for that row. That is, G is set every time $B_n>A_n$.

It should be noted that, for the LSD, P and H are equivalent because no generates or borrows will ever propagate into the LSD. Therefore, in the alternative embodiment of the present invention, which performs subtraction by adding the four's complement of the first input to the second input, the H and P output signals conceptually serve the same function and are collapsed into a single HALT/PROP output. Table 11(a) illustrates the HALT/PROP and G outputs of the four's complement alternative embodiment of the present invention. In Table 11(a), H/P is set any time $B_n \leq A_n$. G is set every time $B_n>A_n$. FIG. 10 illustrates that the alternative LSD gate 910 of the present invention produces outputs in conformity with Table 11(a).

TABLE 11(a)

| B | B (1-of-4) | A | A (1-of-4) | ¯A | ¯A (1-of-4) | Pre-Corr. Diff (B − A) | Diff (B − A) | H/P | G |
| --- | --- | --- | --- | --- | --- | --- | --- | --- | --- |
| 0 | 0001 | 0 | 0001 | 3 | 1000 | 0* | 0 | 0 | 1 |
| 1 | 0010 | 0 | 0001 | 3 | 1000 | 1* | 1 | 0 | 1 |
| 2 | 0100 | 0 | 0001 | 3 | 1000 | 2* | 2 | 0 | 1 |
| 3 | 1000 | 0 | 0001 | 3 | 100 0 | 3* | 3 | 0 | 1 |
| 0 | 0001 | 1 | 0010 | 2 | 0100 | 3 | 1 | 1 | 0 |
| 1 | 0010 | 1 | 0010 | 2 | 0100 | 0* | 0 | 0 | 1 |
| 2 | 0100 | 1 | 0010 | 2 | 0100 | 1* | 1 | 0 | 1 |
| 3 | 1000 | 1 | 0010 | 2 | 0100 | 2* | 2 | 0 | 1 |
| 0 | 0001 | 2 | 0100 | 1 | 0010 | 2 | 2 | 1 | 0 |
| 1 | 0010 | 2 | 0100 | 1 | 0010 | 3 | 1 | 1 | 0 |
| 2 | 0100 | 2 | 0100 | 1 | 0010 | 0* | 0 | 0 | 1 |

TABLE 11(a)-continued

| B | B (1-of-4) | A | A (1-of-4) | ¯A | ¯A (1-of-4) | Pre-Corr. Diff (B − A) | Diff (B − A) | H/P | G |
|---|---|---|---|---|---|---|---|---|---|
| 3 | 1000 | 2 | 0100 | 1 | 0010 | 1* | 1 | 0 | 1 |
| 0 | 0001 | 3 | 1000 | 0 | 0001 | 1 | 3 | 1 | 0 |
| 1 | 0010 | 3 | 1000 | 0 | 0001 | 2 | 2 | 1 | 0 |
| 2 | 0100 | 3 | 1000 | 0 | 0001 | 3 | 1 | 1 | 0 |
| 3 | 1000 | 3 | 1000 | 0 | 0001 | 0* | 0 | 0 | 1 |

FIG. 9 illustrates an embodiment of the present invention 900 that implements the add, carry propagate, subtract (three's complement), and borrow propagate functions, discussed above, into one gate. It will be noted from FIG. 9 that the inputs into the gate 900 comprise a 1-of-2 ADD/SUB selector and two two-bit (one-dit) operands. The value of the 1-of-2 ADD/SUB selector determines whether the gate will perform subtraction or addition. Each of the wires $A_3$, $A_2$, $A_1$, $A_0$, for input A are connected to two separate blocks of four wires comprising the four wires $B_3$, $B_2$, $B_1$, $B_0$ for the B input. Each block of B input wires has been labeled with the conceptual value of the A input associated with that block for the addition function. For instance, the leftmost block of B input wires in FIG. 9, corresponding to an addition value of "0" for A, is labeled as the "+0" block. From left to right in FIG. 9, the remaining blocks of B input wires have been labeled as the "+1", "+2", "+3" blocks, respectively.

The value of the ADD/SUB selector will determine which A input line corresponds to each block of B input wires. For instance, although the $A_0$ wire is coupled to the "+0" block for addition, the three's complement of zero, $A_3$, is coupled to the "+0" block for subtraction. FIG. 9 and Tables 6 and 11 illustrate that this novel scheme produces the desired results for both addition and subtraction. For instance, consider the add and subtract functions for $A_0$, which corresponds to an A input value of zero. If the ADD value is enabled for the ADD/SUB selector, the $A_0$ input value will be logically NAND'ed with the Block "+0" B inputs. Thus, the value of B will be added to zero. In contrast, for subtraction the A input is logically NAND'ed with the Block of B inputs, Block "+3", representing the three's complement of A. If SUB value is enabled for the ADD/SUB selector, the three's complement of zero, i.e., three, will therefore be added to the B input.

In sum, the present invention uses N-NARY logic to perform three functions within one gate. Depending on the value of the ADD/SUB selector, two 1-of-4 numbers are either added to produce a 1-of-4 sum or subtracted to produce a 1-of-4 difference. Also, the gate utilizes carry propagate logic to generate a 1-of-3 HPG signal. The preferred embodiment of the present invention implements subtraction by adding the three's complement of the first input, A, to the second input, B, producing a value for B−A in a pre-correction format. In an alternative embodiment, four's complement addition is implemented to achieve the subtract function.

Other embodiments of the invention will be apparent to those skilled in the art after considering this specification or practicing the disclosed invention. The specification and examples above are exemplary only, with the true scope of the invention being indicated by the following claims.

We claim:

1. An apparatus that processes two N-NARY 1 of N input signals to produce an N-NARY 1 of N signal result and an N-NARY 1 of N signal HPG indicator, comprising:

a 1-of-P first addend input configured to receive the first addend wherein said 1 of P first addend input comprises a 1 of N signal where N is greater than 2;

a 1-of-Q second addend input configured to receive the second addend wherein said 1 of Q second addend input comprises a 1 of N signal where N is greater than 2;

a 1-of-R Add/Sub input configured to receive a 1-of-R operation selector wherein said 1 of R Add/Sub input comprises a 1 of M signal;

a sum/HPG circuit that is configured to perform an arithmetic operation on the addends, based on the value of said operation selector, to produce the result;

said sum/HPG circuit is further configured to perform carry propagate logic to produce the HPG indicator; and said sum/HPG circuit is coupled to said first addend input, said second addend input, and said Add/Sub input, said sum/HPG circuit is further coupled to a 1-of-S result output that is configured to deliver the result wherein said 1 of S result output comprises a 1 of N signal where N is greater than 2, and said sum/HPG circuit is further coupled to a 1-of-T HPG output that is configured to deliver the HPG indicator wherein said 1 of T HPG output comprises a 1 of N signal where N is greater than 2.

2. The apparatus of claim 1 wherein said operation selector comprises one of a predetermined plurality of select values comprising an add selection and a subtract selection.

3. The apparatus of claim 2 wherein said arithmetic operation comprises one of a predetermined plurality of operations comprising an add operation, to be performed when said operation selector comprises said add selection, and a subtract operation to be performed when said operation selector comprises said subtract selector.

4. The apparatus of claim 3 wherein said add operation comprises adding the first addend and the second addend to produce the result.

5. The apparatus of claim 3 wherein said subtract operation comprises converting the first addend to a diminished radix (P−1)'s complement number and adding said diminished radix (P−1)'s complement number to the second addend to produce the result, wherein the result is of the format (P−1)+(second addend−first addend).

6. The apparatus of claim 3 wherein said subtract operation comprises converting the first addend to a radix P's complement number and adding said radix P's complement number to the second addend to produce the result, wherein the result is of the format P+(second addend−first addend).

7. The apparatus of claim 1 wherein said 1-of-T HPG output comprises a 1 of N signal where N=3.

8. The apparatus of claim 1 wherein said 1-of-R Add/Sub input comprises a 1 of M signal where M=2.

9. The apparatus of claim 1 wherein said first addend input comprises a 1 of N signal where N=3, 4, or 5.

10. The apparatus of claim 1 wherein said second addend input comprises a 1 of N signal where N=3, 4, or 5.

11. The apparatus of claim 1 wherein said result output comprises a 1 of N signal where N=3, 4, or 5.

12. A system for processing two N-NARY 1 of N input signals to produce an N-NARY 1 of N signal result and an N-NARY 1 of N signal HPG indicator, comprising:

a 1-of-P first addend input configured to receive the first addend wherein said 1 of P first addend input comprises a 1 of N signal where N is greater than 2;

a 1-of-Q second addend input configured to receive the second addend wherein said 1 of Q second addend input comprises a 1 of N signal where N is greater than 2;

a 1-of-R Add/Sub input signal for receiving a 1-of-R operation selector wherein said 1 of R Add/Sub input comprises a 1 of M signal;

a sum/HPG means for performing an arithmetic operation on the inputs, based on the value of said operation selector, to produce the result, said sum/HPG means further comprises a means for performing carry propagate logic to produce the HPG indicator; and said sum/HPG means is coupled to said first addend input, said second addend input, and said Add/Sub input, said sum/HPG means is further coupled to a 1-of-S result output for delivering the result wherein said 1 of S result output comprises a 1 of N signal where N is greater than 2, and said sum/HPG means is further coupled to a 1-of-T HPG output for delivering the HPG indicator wherein said 1 of T HPG output comprises a 1 of N signal where N is greater than 2.

13. The system of claim 12 wherein said operation selector comprises one of a predetermined plurality of select values comprising an add selection and a subtract selection.

14. The system of claim 13 wherein said arithmetic operation comprises one of a predetermined plurality of operations comprising:

an adding means for adding the addends together, to be performed when said operation selector comprises said add selection, to produce the result; and a subtracting means for subtracting the first addend from the second addend, to be performed when said operation selector comprises said subtract selector, to produce the result.

15. The system of claim 14 wherein said subtracting means further comprises a means for converting the first addend to a diminished radix (P−1)'s complement number and adding said diminished radix (P−1)'s complement number to the second addend to produce the result, wherein the result is of the format (P−1)+(second addend−first addend).

16. The system of claim 14 wherein said subtracting means further comprises a means for converting the first addend to a radix P's complement number and adding said radix P's complement number to the second addend to produce the result, wherein the result is of the format P+(second addend−first addend).

17. The system of claim 12 wherein:

said 1-of-T HPG output comprises a 1 of N signal where N=3; and said 1-of-R Add/Sub input comprises a 1 of M signal where M=2.

18. The system of claim 12 wherein said 1-of-P first addend input comprises a 1 of N signal where N=3, 4, or 5.

19. The system of claim 12 wherein said 1-of-Q second addend input comprises a 1 of N signal where N=3, 4, or 5.

20. The system of claim 12 wherein said 1-of-S result output comprises a 1 of N signal where N=4.

21. A method to manufacture an apparatus that processes two N-NARY 1 of N input signals to produce an N-NARY 1 of N signal result and an N-NARY 1 of N indicator, comprising:

providing a 1-of-P first addend input that is configured to receive the first addend wherein said 1 of P first addend input comprises a 1 of N signal where N is greater than 2;

providing a 1-of-Q second addend input that is configured to receive the second addend wherein said 1 of Q second addend input comprises a 1 of N signal where N is greater than 2;

providing a 1-of-R Add/Sub input that is configured to receive a 1-of-R operation selector wherein said 1 of R Add/Sub input comprises a 1 of M signal;

providing a sum/HPG circuit that is configured to perform an arithmetic operation on the addends, based on the value of said operation selector, to produce the result, said sum/HPG circuit is further configured to perform carry propagate logic to produce the HPG indicator;

coupling said sum/HPG circuit to said first addend input, said second addend input, and said Add/Sub input;

providing a 1-of-S result output that is configured to deliver the result wherein said 1 of S result output comprises a 1 of N signal where N is greater than 2;

further coupling said sum/HPG circuit to said result output;

providing a 1-of-T HPG output that is configured to deliver the HPG indicator wherein said 1 of T HPG output comprises a 1 of N signal where N is greater than 2; and further coupling said sum/HPG circuit to said HPG output.

22. The method of claim 21 wherein said operation selector comprises one of a predetermined plurality of select values comprising an add selection and a subtract selection.

23. The method of claim 22 wherein said step of providing a sum/HPG circuit further comprises providing a sum/HPG circuit wherein said arithmetic operation comprises one of a predetermined plurality of operations comprising:

adding the addends together, to be performed when said operation selector comprises said add selection, to produce the result; and subtracting the first addend from the second addend, to be performed when said operation selector comprises said subtract selector, to produce the result.

24. The method of claim 23 wherein said step of subtracting further comprises converting the first addend to a diminished radix (P−1)'s complement number and adding said diminished radix (P−1)'s complement number to the second addend to produce the result, wherein the result is of the format (P−1)+(second addend−first addend).

25. The method of claim 23 wherein said step of subtracting further comprises converting the first addend to a radix P's complement number and adding said radix P's complement number to the second addend to produce the result, wherein the result is of the format P+(second addend−first addend).

26. The method of claim 21 wherein said step of providing a 1-of-T HPG output further comprises providing a 1 of N signal where N=3.

27. The method of claim 21 wherein said step of providing a 1-of-R Add/Sub input further comprises providing a 1 of M signal where M=2.

28. The method of claim 21 wherein said step of providing a 1-of-P first addend input further comprises a 1 of N signal where N=3, 4, or 5.

29. The method of claim 21 wherein said step of providing a 1-of-Q second addend input further comprises a 1 of N signal where N=3, 4 or 5.

30. The method of claim 21 wherein said step of providing a 1-of-S result output comprises a 1 of N signal where N=3, 4, or 5.

31. A method of processing two N-NARY 1 of N input signals to produce an N-NARY 1 of N signal result and an N-NARY 1 of N signal HPG indicator, comprising:

receiving the 1-of-P first addend wherein said 1 of P first addend input comprises a 1 of N signal where N is greater than 2 and the 1-of-Q second addend wherein said 1 of Q second addend input comprises a 1 of N signal where N is greater than 2;

receiving a 1-of-R operation selector wherein said 1 of R operation selector comprises a 1 of M signal;

performing one of a plurality of selectable predetermined arithmetic operations on the addends to produce the 1-of-S result wherein said 1 of S result comprises a 1 of N signal where N is greater than 2; and performing carry propagate logic on the addends to produce the 1-of-T HPG indicator wherein said 1 of T HPG indicator comprises a 1 of N signal where N is greater than 2.

32. The method of claim 31 wherein said operation selector comprises one of a predetermined plurality of select values comprising an add selection and a subtract selection.

33. The method of claim 31 wherein the 1-of-T HPG indicator comprises a 1 of N signal where N=3 and the 1-of-S result comprises a 1 of N signal where N=4 and wherein said 1-of-R operation selector comprises a 1 of M signal where N=2.

34. The method of claim 31 wherein P equals three, four, or five.

35. The method of claim 31 wherein Q equals three, four, or five.

36. The method of claim 32 wherein said step of performing one of a plurality of selectable predetermined arithmetic operations further comprises:

adding the first addend and the second addend to produce the result, if said operation selector comprises said add selection; and subtracting the first addend from the second addend to produce the result, if said operation selector comprises said subtract selection.

37. The method of claim 36 wherein said step of subtracting further comprises converting the 1-of-P first addend to a diminished radix (P−1)'s complement number and adding said diminished radix (P−1)'s complement number to the second addend to produce the result, wherein the result is of the format (P−1)+(second addend−first addend).

38. The method of claim 36 wherein said step of subtracting further comprises converting the 1-of-P first addend to a radix P's complement number and adding said radix P's complement number to the second addend to produce the result, wherein the result is of the format P+(second addend−first addend).

* * * * *